(12) United States Patent
Hogan

(10) Patent No.: US 6,466,498 B2
(45) Date of Patent: Oct. 15, 2002

(54) DISCONTINUITY-BASED MEMORY CELL SENSING

(75) Inventor: Josh N. Hogan, Los Altos, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/758,875

(22) Filed: Jan. 10, 2001

(65) Prior Publication Data

US 2002/0089869 A1 Jul. 11, 2002

(51) Int. Cl.[7] .................................................. G11C 7/02
(52) U.S. Cl. ......................................... 365/206; 365/105
(58) Field of Search ............................... 365/206, 105, 365/96, 175, 225.7

(56) References Cited

U.S. PATENT DOCUMENTS

| | | | | |
|---|---|---|---|---|
| 3,611,319 A | * | 10/1971 | Hyatt | ........................ 340/173 |
| 4,722,822 A | * | 2/1988 | Thai et al. | ..................... 365/96 |
| 5,379,250 A | * | 1/1995 | Harshield | .................... 365/105 |
| 5,486,776 A | | 1/1996 | Chiang | ......................... 326/41 |
| 5,648,933 A | | 7/1997 | Slemmer | ..................... 365/200 |
| 5,818,749 A | * | 10/1998 | Harshield | .................... 365/105 |
| 5,843,824 A | | 12/1998 | Chou et al. | ................. 438/278 |
| 5,851,884 A | | 12/1998 | Wen | ........................... 438/275 |
| 5,937,280 A | | 8/1999 | Wen | ........................... 438/130 |
| 5,945,840 A | | 8/1999 | Cowles et al. | ................ 326/38 |
| 6,143,610 A | | 11/2000 | Wen et al. | ................... 438/275 |
| 6,150,868 A | | 11/2000 | Kim et al. | .................. 327/525 |

* cited by examiner

Primary Examiner—Richard Elms
Assistant Examiner—Anh Phung

(57) ABSTRACT

Systems and methods that enable the state of a memory cell to be determined with greater accuracy are described. In one memory cell sensing approach, a memory cell is addressed, an input signal is applied to the addressed memory cell over a range of values, and the state of the memory cell is read based upon a discontinuity in a sensed electrical response to the applied input signal values.

20 Claims, 4 Drawing Sheets

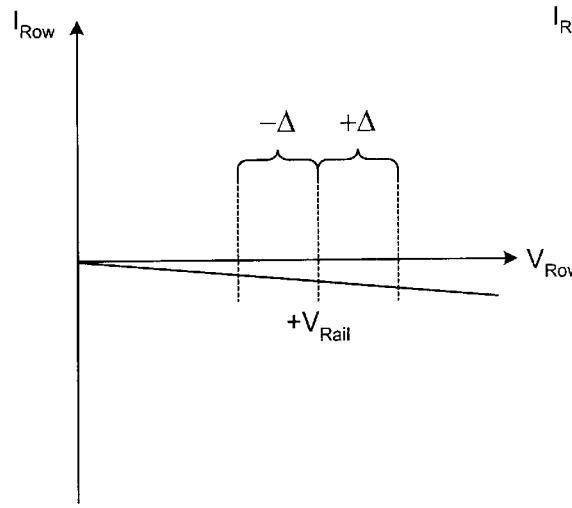
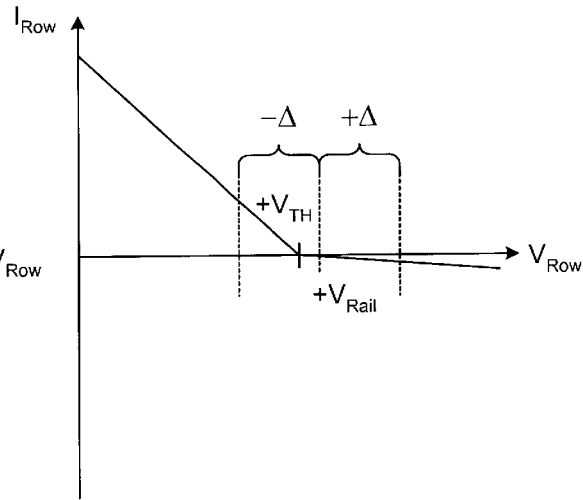
FIG. 3A
FIG. 3B
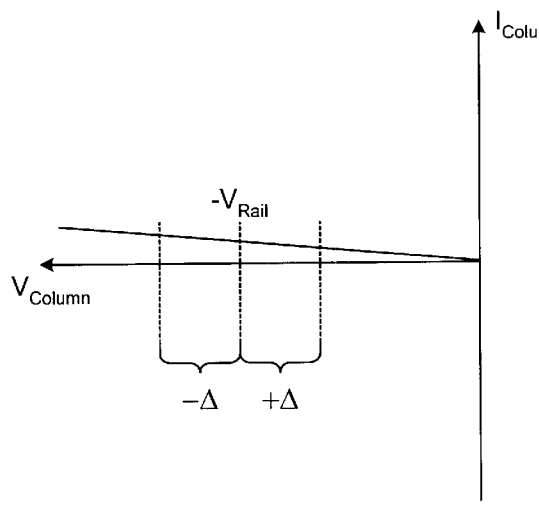
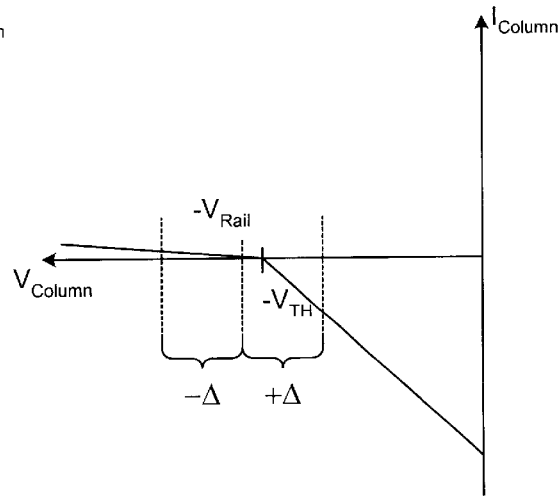
FIG. 4A
FIG. 4B

DISCONTINUITY-BASED MEMORY CELL SENSING

TECHNICAL FIELD

This invention relates to systems and methods for sensing memory cells in memory cell arrays.

BACKGROUND

In general, a memory system includes a plurality of memory elements that are arranged in an array of individually accessible cells. Many different memory systems are available for different applications. For example, volatile memories (e.g., dynamic random access memories), which require a continuous source of power to retain their contents, provide high storage capacity and versatile programming options for microprocessor-based applications. Nonvolatile memories (e.g., read only memories and programmable logic arrays), which do not require a continuous source of power to retain their contents, provide relatively lower storage capacity and limited programming options.

Nonvolatile memories typically store information in one of two ways. In particular, a nonvolatile memory may store a charge or may store a unique physical structure. A charge-storing nonvolatile memory uses a relatively small electrical current to store a charge at a memory element location. A structure-changing memory, on the other hand, typically uses a large electrical current to change the physical structure of a memory element (e.g., a fuse or a chalcogenide memory element). In both charge-storing and structure-changing nonvolatile memories, an access device (e.g., access transistor or an access diode) typically provides individual access to an associated memory element. During a read operation, all of the access devices in the memory array are turned off except the access device associated with the particular memory cell to be read. In the case of a diode-based memory system, the cumulative reverse bias current of the diodes corresponding to the non-sensed memory elements may significantly reduce the signal-to-noise ratio of the sensed response to the signal applied to the memory cell being read, making it difficult to accurately determine the memory state of the cell.

SUMMARY

The invention features a novel memory cell reading scheme (systems and methods) that enables the state of a memory cell to be determined with greater accuracy.

In one aspect, the invention features a memory cell reading scheme in which a memory cell is addressed, an input signal is applied to the addressed memory cell over a range of values, and the state of the memory cell is read based upon a discontinuity in a sensed electrical response to the applied input signal values.

Embodiments of the invention may include one or more of the following features.

The state of the memory cell preferably is read based upon a discontinuity in the sensed electrical response over a range of applied input signal values encompassing a rail voltage value (e.g., within one or more diode drops of the rail voltage value).

The state of the memory cell may be read based upon a discontinuity in direction of the sensed electrical response. The state of the memory cell also may be read based upon a discontinuity in slope of the sensed electrical response. The state of the memory cell may be read based upon the presence or absence of a discontinuity in an electrical response to the applied input signal.

The state of the memory cell may be read multiple times within a read period. A noise immunity process may be applied to the multiple memory cell readings. In one embodiment, the noise immunity process comprises an integrate and dump process. In some embodiments, an electrical response to an applied row signal is sensed and an electrical response to an applied column signal is sensed. A common mode rejection noise immunity process may be applied to the sensed electrical responses to the applied row and column signals.

Among the advantages of the invention are the following.

The invention provides a memory cell reading approach that may be applied readily to diode-based memory systems. In general, the invention is relatively insensitive to noise. For example, the invention is relatively insensitive to noise caused by reverse bias leakage currents that are characteristic of diode-based memory systems. The invention also may be configured to provide a digital sense signal, which may be processed easily by digital processing equipment.

Other features and advantages of the invention will become apparent from the following description, including the drawings and the claims.

DESCRIPTION OF DRAWINGS

FIG. 3A is a diagrammatic graph of a sensed electrical response to a row line signal applied to the memory cell of FIG. 2 when the memory cell is not blown.

FIG. 3B is a diagrammatic graph of a sensed electrical response to a row line signal applied to the memory cell of FIG. 2 when the memory cell is blown.

FIG. 4A is a diagrammatic graph of a sensed electrical response to a column line signal applied to the memory cell of FIG. 2 when the memory cell is not blown.

FIG. 4B is a diagrammatic graph of a sensed electrical response to a column line signal applied to the memory cell of FIG. 2 when the memory cell is blown.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
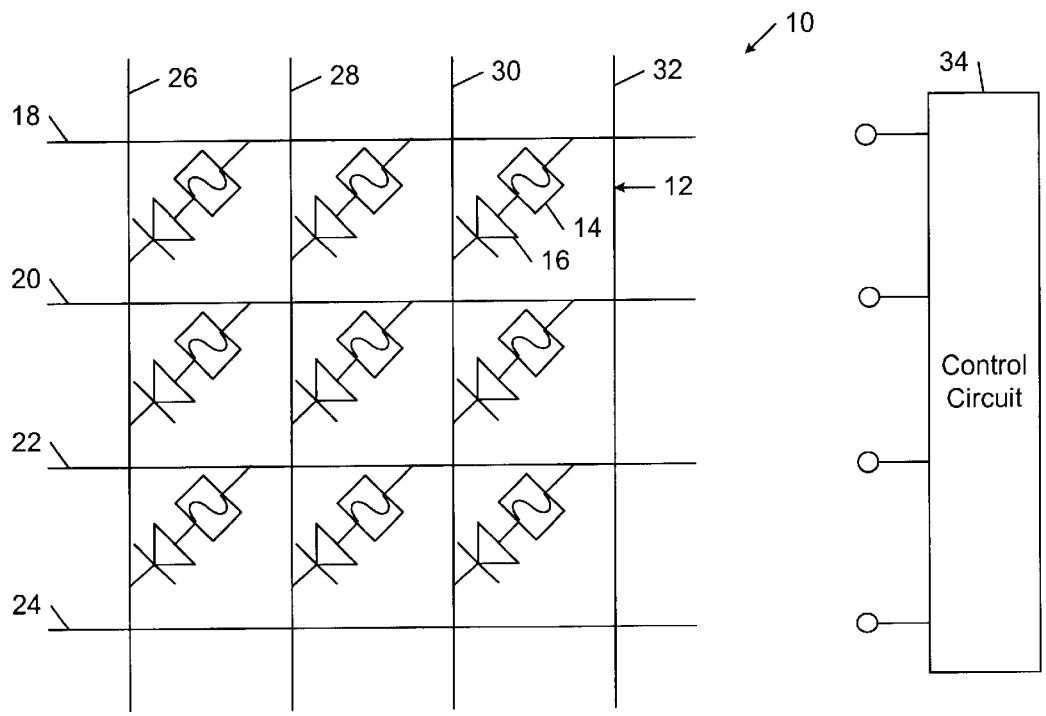
FIG. 1 is a circuit diagram of a portion of a memory cell array.

Referring to FIG. 1, in one embodiment, a memory cell array 10 includes a plurality of memory cells 12 that are arranged in multiple rows and multiple columns. Each memory cell 12 includes a memory element 14 and an access diode 16 that are coupled in series between a respective row line 18, 20, 22, 24 and a respective column line 26, 28, 30, 32. In some embodiments, memory element 14 and access diode 16 may have similar material structures. In this embodiment, memory element 14 is a structure-changing device (e.g., a fuse). In general, memory element 14 may include any structure-changing device that generates a discontinuity in the electrical response sensed at a row line or a column line, or both, when the device is in one memory state and no similar electrical response discontinuity when the device is in another memory state. As shown in FIG. 1, the cathode of each access diode is coupled to a column line 26–32 and the anode of each access diode is coupled to a respective memory element. Each memory element, in turn, is coupled between a respective access diode and a row line 18-24. Thus, the voltage across a memory cell is determined by the voltages applied to the row line and the column line between which the memory cell is coupled. In other embodiments, the positions of access diodes and the memory elements may be reversed. A control circuit 34 is configured to address (or select), program information into, and read information from one or more memory cells 12 within memory cell array 10.

In operation, control circuit 34 may program memory cell array 10 by applying through one or more selected memory cells 12 a current that is sufficient to blow the fuses within the selected cells, thereby breaking the current paths through the selected cells. Thus, in the present embodiment, a memory cell may be in one of two states: blown or not blown. As explained in detail below, to read the contents (or state) of a memory cell 12, control circuit 34 applies a sense voltage to the corresponding row line or the corresponding column line, or both, and senses the electrical response to the applied sense voltage. If a discontinuity is detected in the sensed electrical response, the memory element is determined to be blown; otherwise, the memory element is determined to be intact.

Figure 2:
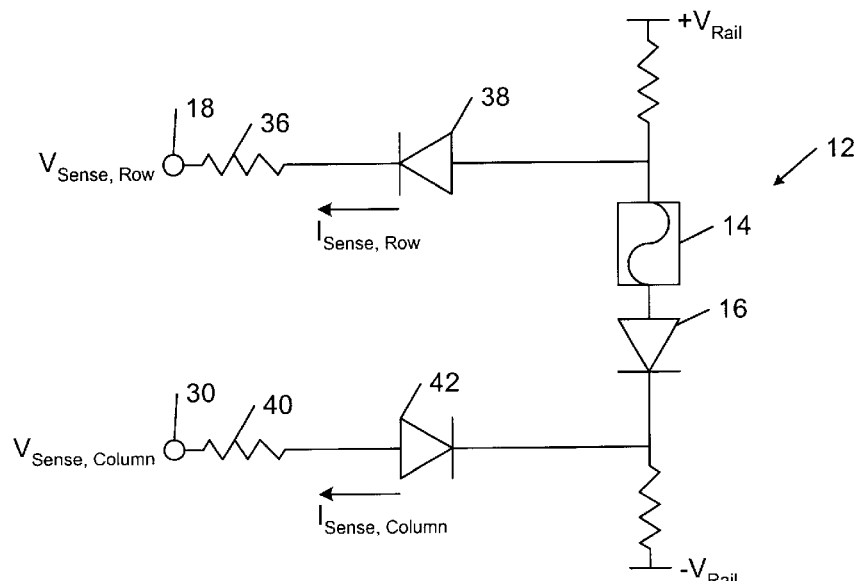
FIG. 2 is a circuit diagram of a memory cell coupled between a row line and a column line of the memory cell array of FIG. 1.

Referring to FIGS. 2, 3A and 3B, in one embodiment, control circuit 34 applies a sense voltage ($V_{Sense, Row}$) to row line 18 through a sense resistor 36 and a sense diode 38. The sense voltage is applied over a range of values ($\pm\Delta$) above and below the positive rail voltage ($+V_{Rail}$). In one embodiment, the sense voltage covers a range of values preferably on the order of one or more diode drops of the positive rail voltage. In one embodiment, the applied sense voltage covers a range of values within 1 volt of the positive rail voltage (i.e., $\Delta=1$ volt). Control circuit 34 detects the response of memory cell 12, for example, by monitoring the current flowing through sense resistor 36. If memory element 14 is not blown, sense diode 38 is reverse biased when the applied sense voltage has a value near the positive rail voltage (see FIG. 3A). As a result, the current ($I_{Sense, Row}$) flowing through sense resistor 36 corresponds to the reverse bias sense diode 38 current, which is negative and has a relatively small variation in slope ($\Delta I/\Delta V$) for applied sense voltages near the positive rail voltage. If memory element 14 is blown, however, sense diode 38 is forward biased when the magnitude of the applied sense voltage is less than one diode drop below the positive rail voltage ($+V_{TH}$) (see FIG. 3B). In this memory state, sense diode 38 is reverse biased when the magnitude of the applied sense voltage is greater than one diode drop below the magnitude of the positive rail voltage ($+V_{TH}$). As a result, the current ($I_{Sense, Row}$) flowing through sense resistor 36 is characterized by a discontinuity in direction (from positive to negative) and slope ($\Delta I/\Delta V$ changes from a relatively large value to a relatively small value) when the applied sense voltage changes from a magnitude below $+V_{TH}$ to a magnitude above $+V_{TH}$. In some cases, the discontinuity in direction may be masked by the accumulation of reverse bias currents in other non-selected memory elements. In such cases, the state of the memory element may be determined by sensing the presence or absence of a discontinuity in the total sense current.

As shown in FIGS. 2, 4A and 4B, control circuit 34 may apply a sense voltage ($V_{Sense, Column}$) to column line 30 through a sense resistor 40 and a sense diode 42. The sense voltage is applied over a range of values ($\pm\Delta$) above and below the negative rail voltage ($-V_{Rail}$). In one embodiment, the sense voltage covers a range of values preferably on the order of one or more diode drops of the negative rail voltage. In one embodiment, the applied sense voltage covers a range of values within 1 volt of the negative rail voltage (i.e., $\Delta=1$ volt). Control circuit 34 detects the response of memory cell 12 by monitoring the current flowing through sense resistor 40. If memory element 14 is not blown, sense diode 42 is reverse biased when the applied sense voltage has a value near the positive rail voltage (see FIG. 4A). As a result, the current ($I_{Sense, Column}$) flowing through sense resistor 40 corresponds to the reverse bias sense diode 42 current, which is negative and has a relatively small variation in slope ($\Delta I/\Delta V$) for applied sense voltages near the negative rail voltage. If memory element 14 is blown, however, sense diode 42 is forward biased when the magnitude of the applied sense voltage is less than one diode drop below the negative rail voltage ($-V_{TH}$) (see FG. 4B). In this memory state, sense diode 42 is reverse biased when the magnitude of the applied sense voltage is greater than one diode drop below the magnitude of the negative rail voltage ($-V_{TH}$). As a result, the current ($I_{Sense, Column}$) flowing through sense resistor 40 is characterized by a discontinuity in direction (from negative to positive) and slope ($\Delta I/\Delta V$ changes from a relatively large value to a relatively small value) when the applied sense voltage changes from a magnitude below $-V_{TH}$ to a magnitude above $-V_{TH}$. As explained above in connection with sense diode 38, in some cases, the discontinuity in direction may be masked by the accumulation of reverse bias currents in other non-selected memory elements. In such cases, the state of the memory element may be determined by sensing the presence or absence of a slope discontinuity in the total sense current.

Figure 5:
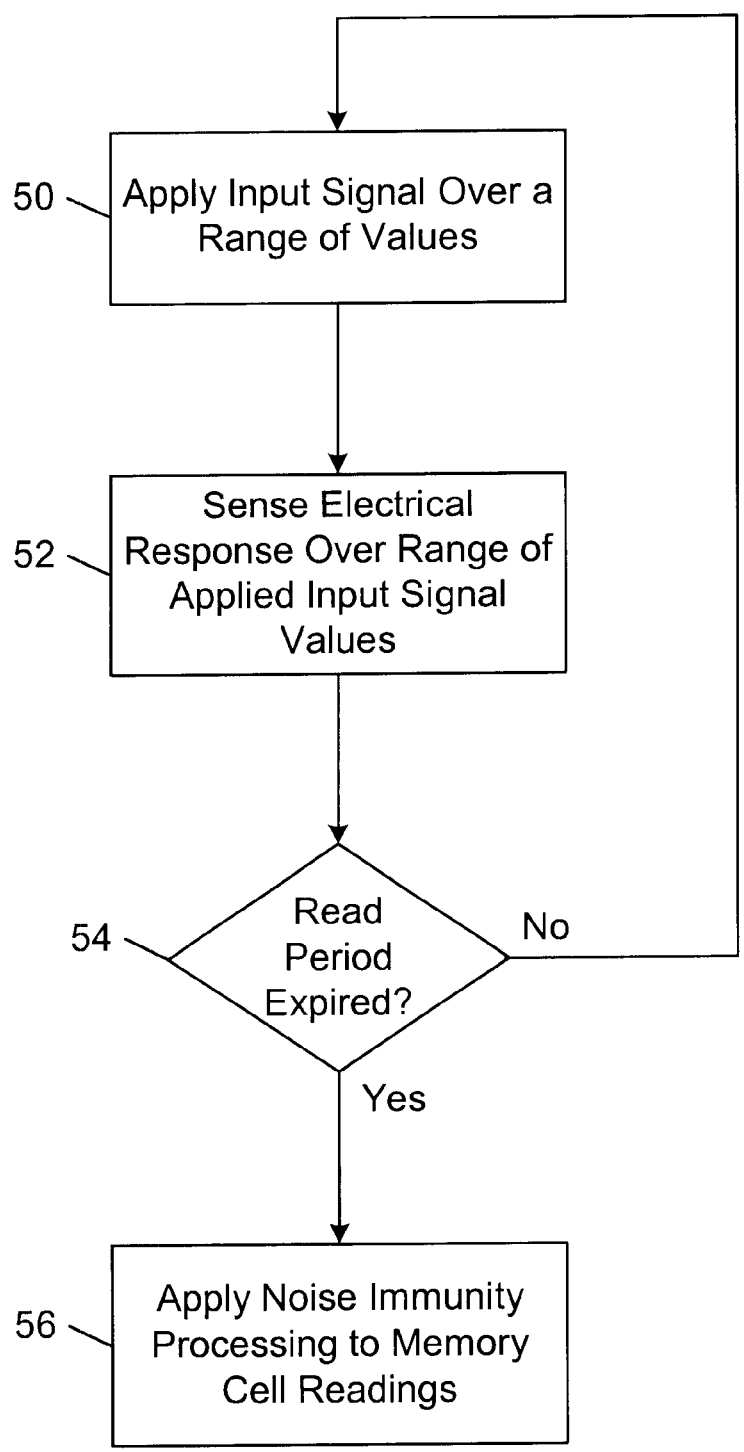
FIG. 5 is a plot of a method of reading the memory cell of FIG. 2.

Referring to FIG. 5, in one embodiment, memory cell 12 may be read by control circuit 34 as follows. Control circuit 34 applies to memory cell 12 an input signal over a range of values (step 50). The input signal may be applied to row line 18 or column line 30, or both. Control circuit 34 senses the electrical response over the range of applied input signal values (step 52). The electrical response is sensed at the line (or lines) through which the input signal (or signals) was applied to memory cell 12. If the read period has not expired (step 54), memory cell 12 is read again (steps 50, 52). After the read period has expired (step 54), noise immunity processing is applied to the memory cell readings (step 56). The noise immunity processing may include one or more conventional signal processing techniques, including digital and analog (e.g., an integrate and dump) processing techniques. If electrical responses from both row line 18 and column line 30 are sensed, the memory cell reading accuracy of control circuit 34 may be improved by a conventional common mode rejection combination of the sensed electrical responses.

Figure 6:
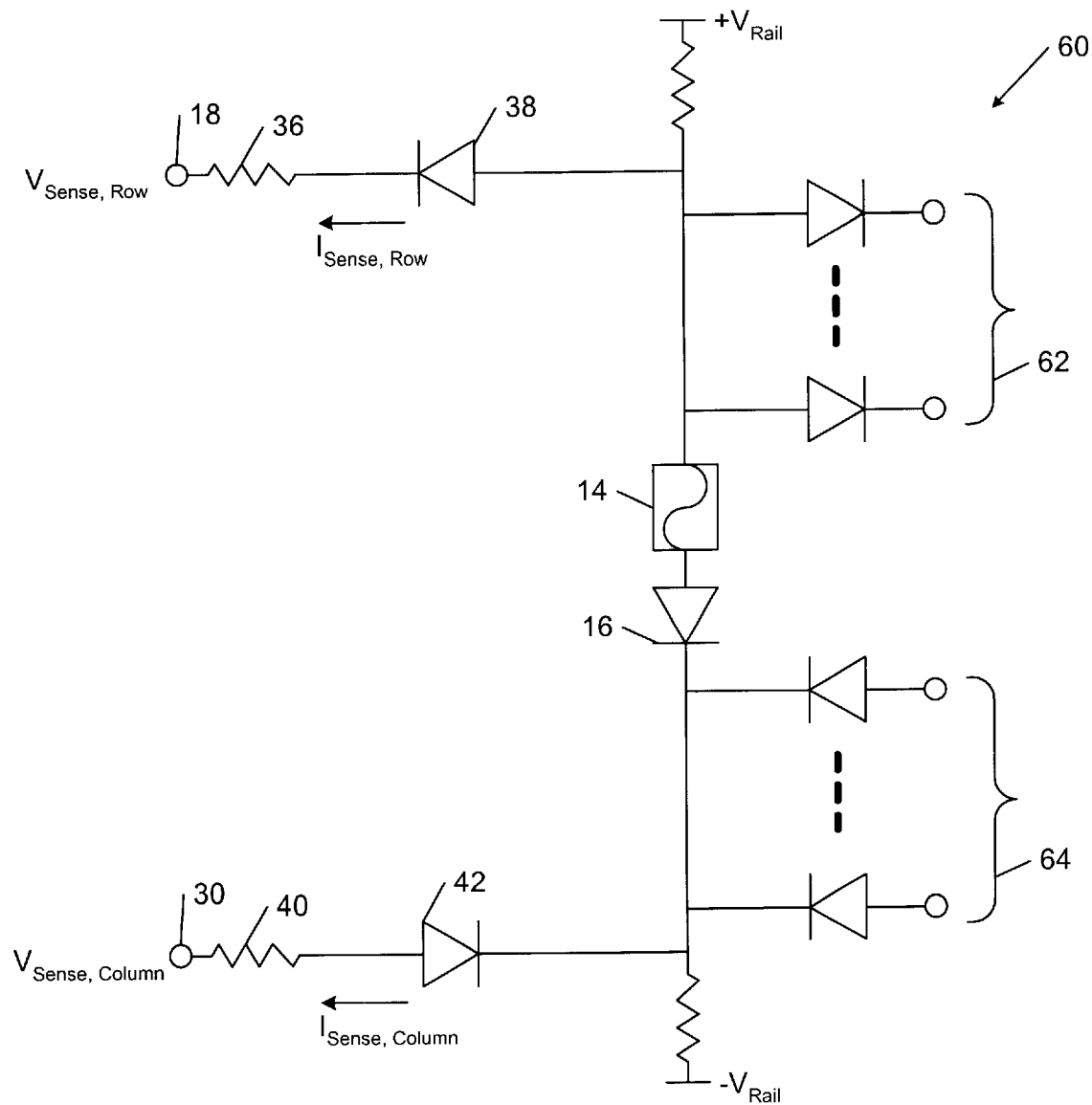
FIG. 6 is a circuit diagram of a memory cell coupled between a row line and a column line of an alternative memory cell array.

Referring to FIG. 6, in one embodiment, the above-described memory cell reading approach may be used in connection with a write-once memory cell array formed from a plurality of memory cells 60. Each memory cell 60 includes, in addition to memory element 14 and access diode 16, one or more row address lines 62 and one or more column address lines 64. In this embodiment, memory cell 60 is selected only if the voltages applied to row address lines 62 are high ($+V_{Rail}$) and the voltages applied to column address lines 64 are low ($-V_{Rail}$) (i.e., none of the row or column address diodes are conducting). The state of a selected memory cell 60 may be read by applying a sense voltage to the corresponding row line or the corresponding column line, or both, and sensing the electrical response to the applied sense voltage, as described above. In particular, if a discontinuity is detected in the sensed electrical response, the memory element is determined to be blown; otherwise, the memory element is determined to be intact. The above-described noise immunity processing techniques also may be applied to the sensed electrical responses to improve the memory cell reading accuracy of control circuit 34.

In each of the above-described embodiments, control circuit 34 may be configured to produce a digital output signal that is indicate of a memory cell state based upon the presence or absence of a detected discontinuity in electrical response to a sense signal applied to the memory cell being read. The digital output signals from control circuit 34 readily may be processed by subsequent signal processing equipment.

The systems and methods described herein are not limited to any particular hardware or software configuration, but rather they may be implemented in any computing or processing environment. The memory cell reading process and noise immunity processes preferably are implemented in a high level procedural or object oriented programming language; however, the programs may be implemented in assembly or machine language, if desired. In any case, the programming language may be a compiled or interpreted language.

Other embodiments are within the scope of the claims. For example, the above-described memory cell reading embodiments may be used with any conventional diode-based memory that includes a structure-changing element that produces a discontinuity in the sensed electrical response when the structure-changing element is in one memory state and no similar discontinuity when the structure-changing element is in another memory state.

What is claimed is:

1. A method of reading a memory cell in a memory cell array comprising:
   addressing a memory cell;
   applying to the addressed memory cell an input signal over a range of values; and
   reading the state of the memory cell based upon a discontinuity in a sensed electrical response to the applied input signal values.

2. The method of claim 1, wherein the state of the memory cell is read based upon a discontinuity in the sensed electrical response over a range of applied input signal values encompassing a rail voltage value.

3. The method of claim 2, wherein the state of the memory cell is read based upon a discontinuity in the sensed electrical response over a range of applied input signal values on the order of one or more diode drops of the rail voltage value.

4. The method of claim 1, wherein the state of the memory cell is read based upon a discontinuity in direction of the sensed electrical response.

5. The method of claim 1, wherein the state of the memory cell is read based upon a discontinuity in slope of the sensed electrical response.

6. The method of claim 1, wherein the state of the memory cell is read based upon the presence or absence of a discontinuity in an electrical response to the applied input signal.

7. The method of claim 1, further comprising reading the state of the memory cell multiple times within a read period.

8. The method of claim 7, further comprising applying a noise immunity process to the multiple memory cell readings.

9. The method of claim 8, wherein the noise immunity process comprises an integrate and dump process.

10. The method of claim 1, wherein an electrical response to an applied row signal is sensed and an electrical response to an applied column signal is sensed.

11. The method of claim 10, further comprising applying a common mode rejection noise immunity process to the sensed electrical responses to the applied row and column signals.

12. A system for reading a memory cell in a memory cell array, comprising:
    a control circuit configured to address a memory cell, apply to the memory cell an input signal over a range of values and read the state of the memory cell based upon a discontinuity in a sensed electrical response to the applied input signal values.

13. The system of claim 12, wherein the state of the memory cell is read based upon a discontinuity in the sensed electrical response over a range of applied input signal values encompassing a rail voltage value.

14. The system of claim 13, wherein the state of the memory cell is read based upon a discontinuity in the sensed electrical response over a range of applied input signal values on the order of one or more diode drops of the rail voltage value.

15. The system of claim 12, wherein the state of the memory cell is read based upon a discontinuity in direction of the sensed electrical response.

16. The system of claim 12, wherein the memory cell is sensed based upon a discontinuity in slope of the sensed electrical response.

17. The system of claim 12, wherein the state of the memory cell is read based upon the presence or absence of a discontinuity in an electrical response to the applied input signal.

18. The system of claim 12, wherein the control circuit is configured to read the state of the memory cell multiple times within a read period.

19. The system of claim 18, wherein the control circuit is configured to apply a noise immunity process to the multiple memory cell readings.

20. The system of claim 12, wherein the control circuit is configured to apply a common mode rejection noise immunity process to sensed electrical responses to an applied row signal and an applied column signal.

* * * * *